(12) United States Patent
Morton

(10) Patent No.: US 7,234,089 B2
(45) Date of Patent: Jun. 19, 2007

(54) TRISTATE BUSES

(75) Inventor: Gary Morton, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 776 days.

(21) Appl. No.: 10/011,257

(22) Filed: Oct. 27, 2001

(65) Prior Publication Data

US 2003/0093732 A1    May 15, 2003

(51) Int. Cl.
    *G01R 31/28*    (2006.01)
(52) U.S. Cl. ...................................... 714/726
(58) Field of Classification Search ................ 714/726, 714/724, 727, 733, 734, 43, 729
    See application file for complete search history.

(56) References Cited

U.S. PATENT DOCUMENTS 6,543,018 B1 *    4/2003    Adusumilli et al. ........ 714/729

\* cited by examiner

*Primary Examiner*—James C Kerveros
(74) *Attorney, Agent, or Firm*—Lisa K. Jorgenson; James H. Morris; Wolf, Greenfield & Sacks, P.C.

(57) ABSTRACT

Circuitry for testing and implementing a distributed tristate bus, the circuitry being configured in the testing mode, when a first signal is supplied to a first enable input and a test enable signal is operative, the cascade circuitry outputs a cascade out signal to the cascade input via the cascade output, causing the second cascade circuitry to disable the enable input of the second tristate cell, thereby to reduce the possibility of contention of the data bus during scan testing.

11 Claims, 6 Drawing Sheets

TRISTATE BUSES

FIELD OF INVENTION

The present invention relates to the field of tristate buses, and, more particularly, to the post-manufacture testing of the components of such buses.

BACKGROUND TO INVENTION

Testing is critical to ensuring that manufactured integrated circuits meet certain quality levels. Due to the inherent complexity of modern integrated circuitry, it had become increasingly difficult to test every conceivable combination of circuit states due to the length of time it takes to scan data serially in and out of registers within the circuitry. Testers have endeavoured to reduce these times whilst still providing good coverage by generating libraries of tests for particular circuits that provide acceptable fault coverage in the minimum time. It has been found that tests generated to provide good "stuck-at" fault (in which a circuit point is incorrectly bridged to ground or the power supply) coverage have the corollary of tending to provide good testing of the circuits overall.

Tristate devices are well known in the electronics and computing fields, enabling data to be selectively placed onto a bus when in a first mode, whilst offering a high impedance load to the bus when in a second mode.

An exemplary tristate bus 1 is shown in FIG. 1. Each cell 10 is connected to a bus 11, and includes a data input Dx and an enable input ENx. When the enable input is high, the value of the data input Dx is put onto the bus 11 via an output buffer 12. It will be understood that, in operation, it is important that only a single cell 10 be enabled at any one time, to ensure that there is no conflict on the bus. When the enable input is low, the output of the tristate cell presents a high impedance load to the bus.

The nature of tristate circuitry means that with certain designs, post-manufacture testing can be difficult, especially for stuck-at faults within enable circuitry. For example, in FIG. 3, there is shown a situation in which enable input 30 is stuck-at-0, even though it is being driven by a logical 1. The result of this is that the bus is floating, meaning there is a 50% chance that the fault will not be detected at the output buffer.

Similarly, in FIG. 4 there is shown a situation in which enable input 40 is stuck-at-1. In the event that different data values are output by the cell 41 actually being tested and the cell 42 with the enable input stuck-at-1, the bus is again in an undetermined state. Where the data values on the faulty driver and the enabled drivers are the same (as shown in FIG. 5), the output is as expected, even though the circuit is faulty. A stuck-at-1 fault on an enable line therefore also produces the possibility that the fault will not be detected. Similar problems occur if faults occur anywhere along the lines that supply enable signals to the tristate cells.

Also of concern is bus contention, which arises when two or more enable inputs are enabled and the data they are attempting to put onto the bus are different. This can happen as shown in FIG. 2, where each enable is controlled by a scan chain of flip-flops 20. In use, the state machine of which the flip-flops form part is designed to ensure that only one of the flip-flops is set to a logical 1 in any cycle, ensuring that contention cannot take place. However, during scan chain loading when testing, it is likely that several of the flip-flops in any shift cycle will have a logical 1 value, which can generate contention on the bus.

Also of concern to chip designers is the increasing number of components and blocks that are squeezed onto chips. One problem with this is that during testing, certain states can arise in which the chip draws more current than it is designed to tolerate. This can lead to component failure, or at least overheating. It is therefore desirable to allow testing of blocks within a circuit by disabling one or more other blocks. However, this can provide difficulties when blocks that a tester would prefer to disable must be enable to allow data to pass through them.

SUMMARY OF INVENTION

The present invention provides circuitry for testing and implementing a distributed tristate bus arrangement, the distributed tristate bus arrangement including:
 a data bus;
 a first block having at least a first tristate cell including:
  a first enable input for receiving a first enable signal; a first data input for receiving data; a first data output in communication with the data bus; first cascade circuitry having a first cascade input for accepting a first test signal, the first cascade circuitry also accepting the first enable input; a cascade output; and first test enabling circuitry for testing the first tristate cell when in a testing mode;
 a second block having at least a second tristate cell including: a second enable input for receiving a second enable signal; a second data input for receiving data; a second data output in communication with the data bus; second cascade circuitry having a second cascade input for accepting a second test signal, the second cascade circuitry also accepting the second enable input; a cascade input operatively connected to the cascade output; and second test enabling circuitry for testing the second tristate cell when in a testing mode;
 the circuitry being configured such that in the testing mode, when the first enable signal is supplied to the first enable input and the test enable signal is operative, the cascade circuitry outputs a cascade out signal to the cascade input via the cascade output, causing the second cascade circuitry to disable the enable input of the second tristate cell, thereby to reduce the possibility of contention on the data bus during scan testing Preferably, the first block includes one or more additional tristate cells of sequentially lower priority, each of the additional tristate cell having: respective enable inputs for receiving enable signals; respective data inputs for receiving data; and respective data outputs in communication with the data bus; the cascade circuitry being configured to accept the enable signals of all of the respective additional tristate cells, the circuitry being configured such that in the testing mode, when an enable signal is supplied to one of the enable inputs and the test enable signal is operative, the cascade circuitry disables the enable inputs of all tristate cells of lower priority, and outputs the cascade out signal via the cascade out, thereby to reduce the possibility of contention on the data bus during scan testing.

In a preferred form, the circuitry includes one or more additional blocks, each of the additional blocks including: one or more tristate cells; a cascade input for receiving a cascade signal from the cascade output of a previous block; and cascade circuitry; the circuitry being configured such that in the testing mode, when an enable signal is supplied to one of the enable inputs and the test enable signal is operative, the cascade circuitry in the block receiving the enable signal disables the enable inputs of any tristate cells of lower priority in that block and, in the event there is a downstream block, outputs a cascade out signal to that block which in turn disables enables on all its tristate cells, the cascade output signal being rippled down to subsequent blocks such that all tristate cells in all blocks downstream of the block to which an enable signal is input are disabled.

Preferably, the cascade circuitry for each block includes an OR gate for each of the tristate cells, an input of each OR gate being connected to the enable input of the corresponding tristate cell, In such embodiments, an output of each OR gate is connected to an input of one of the OR gates associated with a tristate cell further downstream.

In a preferred form, each block includes: an isolation OR gate configured to accept as inputs: an isolation signal; and a cascade signal from an upstream block; and a multiplexor controlled by the isolation signal. In such embodiments, the circuitry is configured such that when the isolation signal is active the multiplexor passes the cascade input directly to the cascade output of the block, and when the isolation signal is inactive the multiplexor accepts an output from the OR gate associated with the lowest priority tristate cell in the block.

Preferably, each tristate cell in each of the blocks includes an associated isolating logic accepting as inputs the test enable signal and a cascade signal from the OR gate associated with the immediately upstream tristate cell. In that case, when the test enable signal is active and an enable signal is applied to one of the tristate cells, the OR gate associated with that cell causes the downstream OR gates and isolating logic to disable all downstream tristate cells.

In a preferred form the circuitry further includes buskeeper circuitry operatively connected to the data bus for receiving the test enable signal. The buskeeper circuitry is configured to act in a test mode when the test enable input is asserted and in a bus-keeping mode the when the test enable input is not asserted. In bus-keeping mode the circuitry maintains the last data value placed onto the bus. In test mode, the circuit weakly pulls the bus to a logical 1 or 0 value.

Preferably, the buskeeping circuitry includes a buskeeper NOR gate for receiving the test enable signal as an input. In that embodiment, an output of the buskeeper NOR gate is connected to an input of a weakly driven inverter, and an output of the weakly driven inverter is connected to the data bus and to an second input of the buskeeper NOR gate.

BRIEF DESCRIPTION OF DRAWINGS

The present invention will now be described, by way of example only, with reference to the accompanying drawings, in which.

DETAILED DESCRIPTION OF PREFERRED AND OTHER EMBODIMENTS

Figure 6:
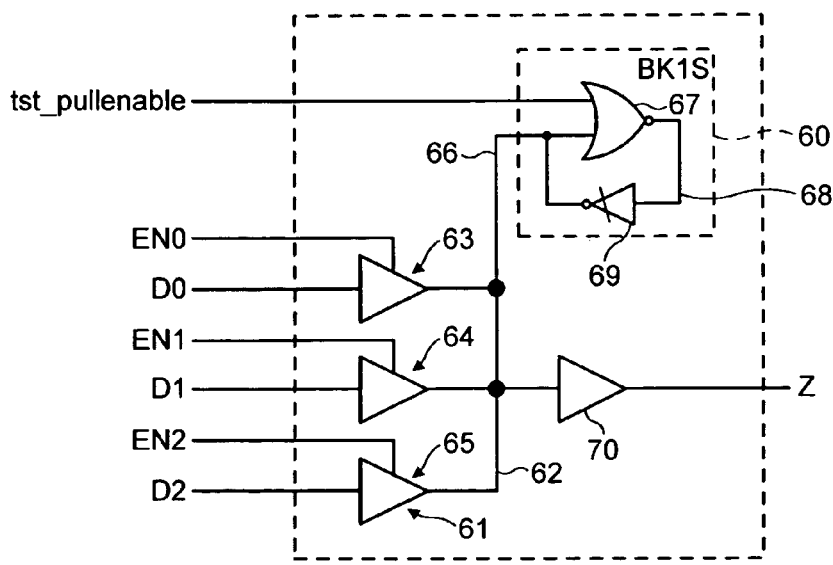
FIG. 6 is a schematic of the tristate bus arrangement of FIGS. 1 to 5, incorporating additional prior art circuitry providing a selective weak pull up on the data bus.

Referring to FIG. 6, there is shown circuitry 60 for testing and operating a tristate bus arrangement 61. The tristate bus arrangement 61 includes a data bus 62, a first tristate cell 63, a second tristate cell 64 and a third tristate cell 65. It will be appreciated that the number of tristate cells is arbitrary, and that three have been shown to simplify the description of the arrangement. The description of these prior art cell is relevant to the later description of the preferred embodiment.

Each of the tristate cells 63, 64 and 65 has an enable input ENx for receiving an enable signal, a data input Dx for receiving data and a data output OUTx that is in communication with the data bus 62.

The enable inputs ENx receive enable control signals from a bus controller (not shown). The bus controller supplies the control signals to the enable inputs in such a way that only one of the tristate cells is enabled at any given time. When one of the cells is enabled by way of such a control signal, the data at the corresponding data input is put onto the data bus 62 via the corresponding data output. As with standard tristate arrangements, when an enable output is not asserted, the corresponding output presents a high impedance to the data bus.

The specific circuitry involved in each tristate cell is not described in detail, because the specifics of the design are not relevant to an understanding of the preferred embodiment below.

The circuitry 60 has test enable input in the form of a line labelled "tst_pullenable". A second input 66 of the circuitry 60 is connected to the data bus 62. The circuitry 60 includes a NOR gate 67 which accepts as inputs the test enable input "tst_pullenable" and the second input 66. An output 68 of the NOR gate 67 is in turn connected to an inverting feedback buffer 69, the output of which connects to the second input.

In use, the circuitry, and thereby the tristate bus arrangement, is selectively operable in two modes. A first mode is used when the circuitry is being automatically tested after manufacture. In this mode, the tst_pullenable input to the circuitry 60 is asserted, which causes the circuitry 60 to behave as a weak pull-up circuit. In effect, this means that the bus is prevented from being in a "floating" state.

Figure 1:
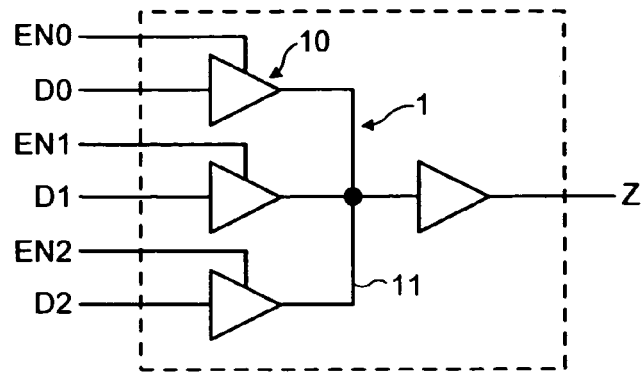
FIG. 1 is a schematic of a prior art tristate bus arrangement.
Figure 2:
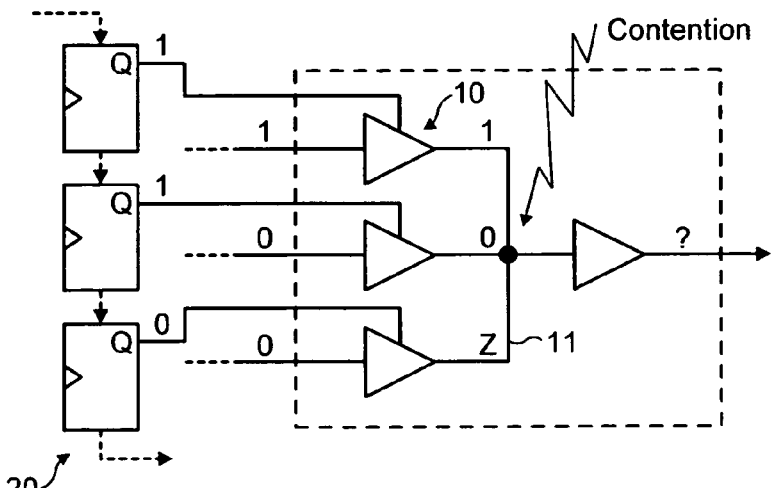
FIG. 2 is a schematic of the tristate bus arrangement of FIG. 1, driven such that there is a bus contention.
Figure 3:
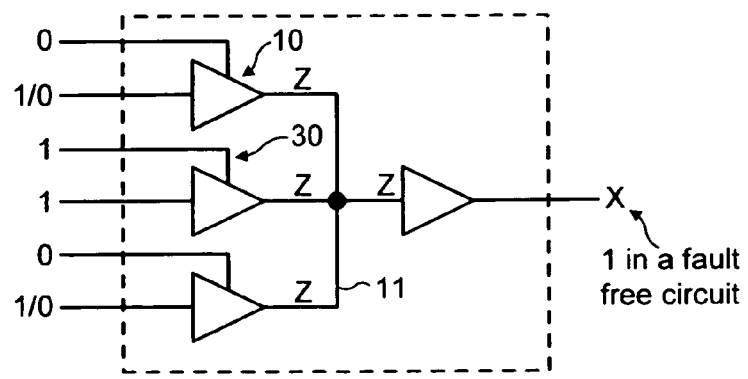
FIG. 3 shows the tristate bus arrangement of FIG. 1, showing the response to a stuck-at 0 on driver enable scenario.
Figure 7:
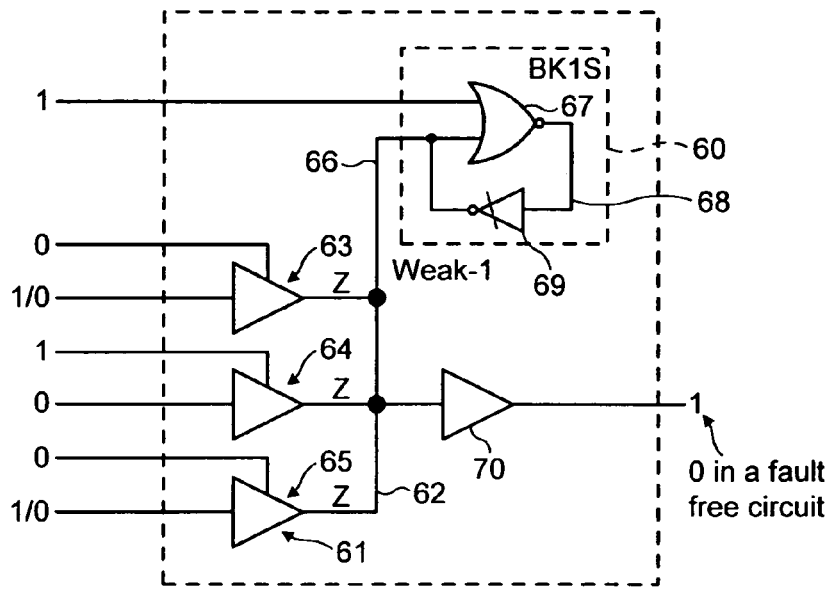
FIG. 7 shows the tristate bus arrangement of FIG. 6, showing the response to a stuck-at 0 on driver enable scenario.

The scenario in FIG. 7 is analogous to that previously described in relation to FIG. 3, in that the there is a stuck at 0 fault in the second tristate cell 64. However, in this case, the tst_pullenable input to the circuitry 60 is held high for testing. In the fault free circuit, all the tristate cells are disabled, allowing the bus to float. The effect of the circuitry 60 is to weakly pull this floating bus to a high logic level. The bus output, as read by an output buffer 70, is therefore a logical 1.

Considering the circuit behaviour with a stuck at 0 fault in the second tristate cell 64, it can be seen that this cell drives the bus strongly with the value on its input. A zero value is chosen and applied to the input of tristate cell 64 resulting in a 0 logic level being applied to the tristate bus by way of the faulty cell 64. This string 0 over-rides the weak pull-up of the circuitry 60. The bus output, as read by an output buffer 70, is therefore a logical 0. It is therefore clear to a tester that there is an error within the second tristate cell 64.

Figure 4:
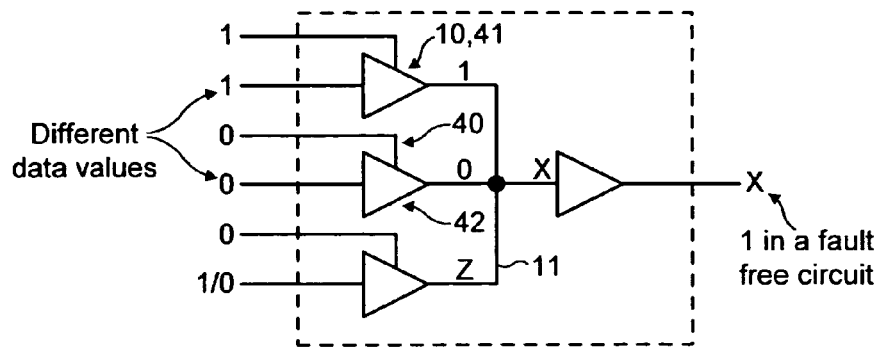
FIG. 4 shows the tristate bus arrangement of FIG. 1, showing the response to a stuck-at 1 on driver enable scenario and different data values on two tristate cells.
Figure 5:
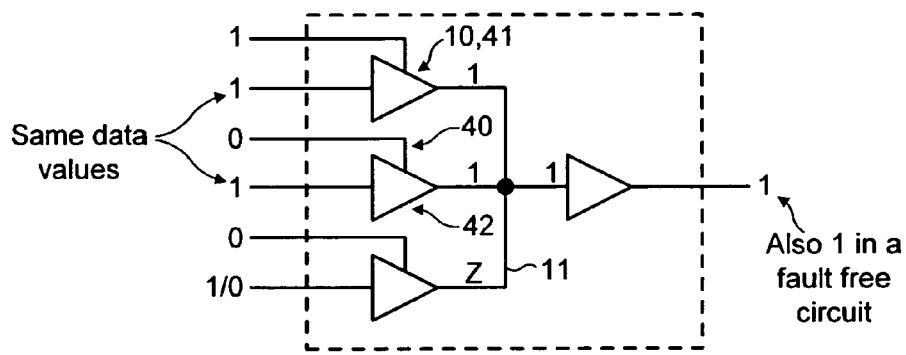
FIG. 5 shows the tristate bus arrangement of FIG. 4, showing the response to a stuck-at 1 on driver enable scenario and the same data values on two tristate cells.
Figure 8:
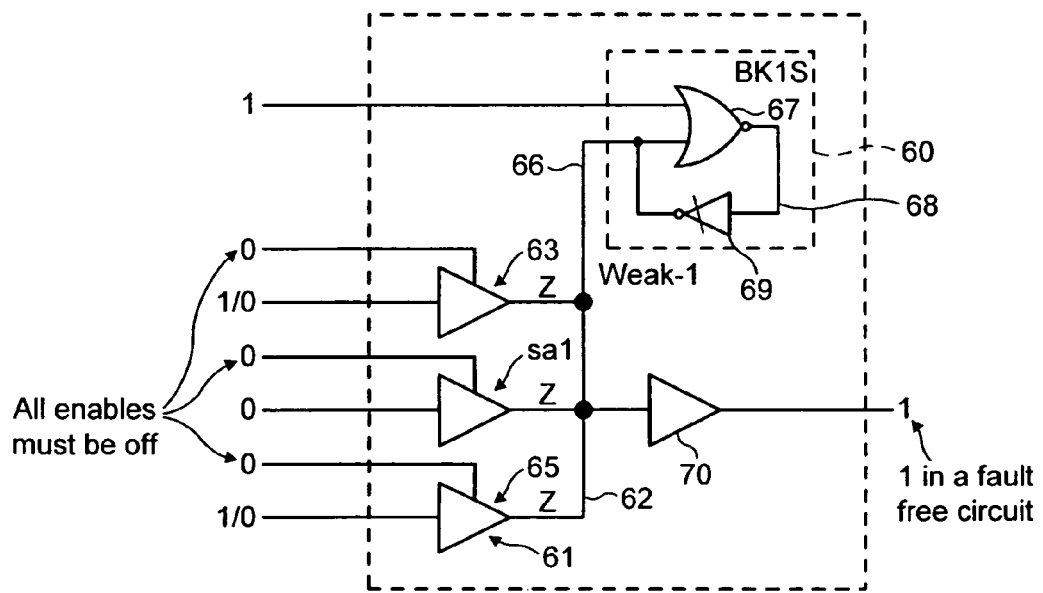
FIG. 8 shows the tristate bus arrangement of FIG. 6, showing the response to a stuck-at 1 on driver enable scenario.

The scenario in FIG. 8 is analogous to that described previously in relation to FIGS. 4 and 5, and again there is a stuck-at-1 fault with the second tristate cell 64. However, in this case the tst_pullenable input to the circuitry 60 is again held high for testing and all enables are set to logical 0. Now, when a logical 0 is provided at the input to the second tristate cell 64, the data bus 62 is not merely left in a floating state due to the incorrect operation of the second tristate cell. The circuitry 60 still attempts to weakly pull the bus value high. However, the incorrect operation of the second tristate cell 64 results in a logical 0 being placed onto the bus and overriding the weak logical 1. The bus output, as read by the output buffer 70, is therefore a logical 0, rather than the logical 1 that would be expected from the given enable land data values. It is therefore clear to a tester that there is an error with the second tristate cell 64.

By contrast, when the tst_pullenable signal is not asserted, the tristate arrangement 60 behaves similarly to a regular tristate arrangement with a bus keeper. In essence, the circuitry 60 latches the last value placed onto the data bus 62 by one of the tristate cells 63, 64 or 65. This prevents the bus from being placed into a floating mode when no data is actively being placed onto it by one of the tristate cells.

Figure 9:
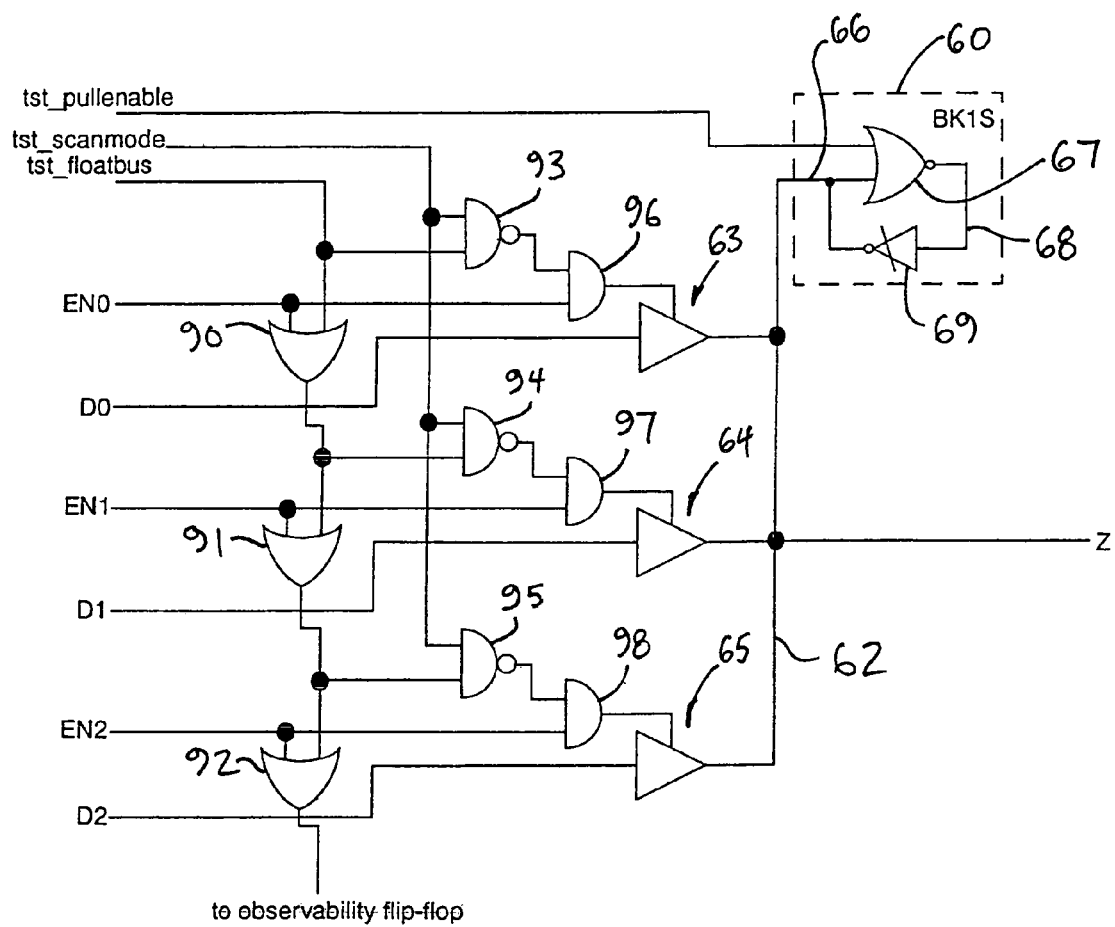
FIG. 9 is schematic of an alternative tristate bus arrangement incorporating circuitry according to the invention.

Turning to FIG. 9, there is shown circuitry according to the preferred embodiment. Many of the features described in relation to the earlier Figures operate in the same way, and similar items are indicated with like numerals.

In this case, the circuitry includes first, second and third OR gates 90, 91 and 92 associated with respective corresponding tristate cells 63, 64 and 65. Each of the OR gates 90, 91 and 92 accepts an input from the tristate cell with which it is associated. The second OR gate 91 accepts the output of the first OR 90 as an input and the third OR gate 92 accepts the output of the second OR gate 91 as an input. The other input to the first OR gate 90 is a cascade input, called tst_floatbus in FIGS. 9 to 11.

In the simplest form of the invention, the output of the third OR gate 92 is supplied to an observability flip-flop, for use in testing. The use of observability flip-flops is well known in the field of testing integrated circuitry, and so is not described in the present specification. In other embodiments, and as discussed below, the output of the third OR gate can be supplied to other blocks as a cascade input.

Each of the tristate cells 63, 64 and 65 also has an associated NAND gate (93, 94 and 95 respectively) and an AND gate (96, 97 and 98 respectively). Each of the NAND gates accepts a test enable signal, called tst_scanmode in FIGS. 9 to 11. The first NAND gate 93 also accepts the tst_floatbus signal as an input. The second NAND gate 94 accepts as an input the output of the first OR gate 90 and the third NAND gate 95 accepts as an input the output of the second OR gate 91.

The outputs of the first, second and third NAND gates 93, 94 and 95 are provided as inputs to the respective AND gates 96, 97 and 98. The first AND gate 96 also accepts EN0 as an input, whilst the second and third AND gates 97 and 98 accepted EN1 and EN2 as inputs respectively.

The effect of the additional gates is to allow the circuitry to be placed into a number of test modes. As described above in relation to the prior art tristate arrangement, scan-wise loading of the flip-flops that feed data to the enable inputs of the tristate cells can result in the possibility of undesirable states arising. Typically, this would include bus contention where more than one tristate cell is enabled and differing data values are attempted to be placed on the data bus simultaneously.

In use, the arrangement of FIG. 9 operates in its normal, non-testing mode when the tst_pullenable, tst_scanmode and tst_floatbus signals are held low (ie, inactive). In this situation, the enable signals are effectively passed directly to the relevant tristate cell. Contention is avoided by careful design of the logic that feeds the cells. There is therefore no need to guard further against such contention.

In one testing mode, the tst_floatbus signal is made active, which causes the outputs of all the OR gates 90, 91 and 92 to be pulled high. The tst_pullenable signal is also pulled high. The effect of the tst_floatbus signal on the NAND gates 93, 94 and 95 is to place all of the tristate cells 63, 64 and 65 into their inactivated, high impedance output states. In this way, the tristate cells can be tested in relation to their high-impedance mode of operation.

In an alternative testing mode, the tst_scanmode signal is pulled high in conjunction with the tst_pullenable signal. In this mode, enabling a particular tristate cell will cause the enable input of all other tristate cells further downstream to be disabled. For example, if EN1 is enabled, then the output of the second OR gate 91 is pulled high, which effectively disables the third tristate cell 65 due to the output of the third NAND gate 95 being pulled low. In this way, data being scanned in via scan chain flip-flops cannot cause a contentious situation on the bus.

The output of the third OR gate 92 can be supplied to another block similar to that shown in FIG. 9. In this way, contention during scan testing of a distributed tristate bus can still be avoided, without the need for complex circuitry or signal routing to the individual blocks.

Figure 10:
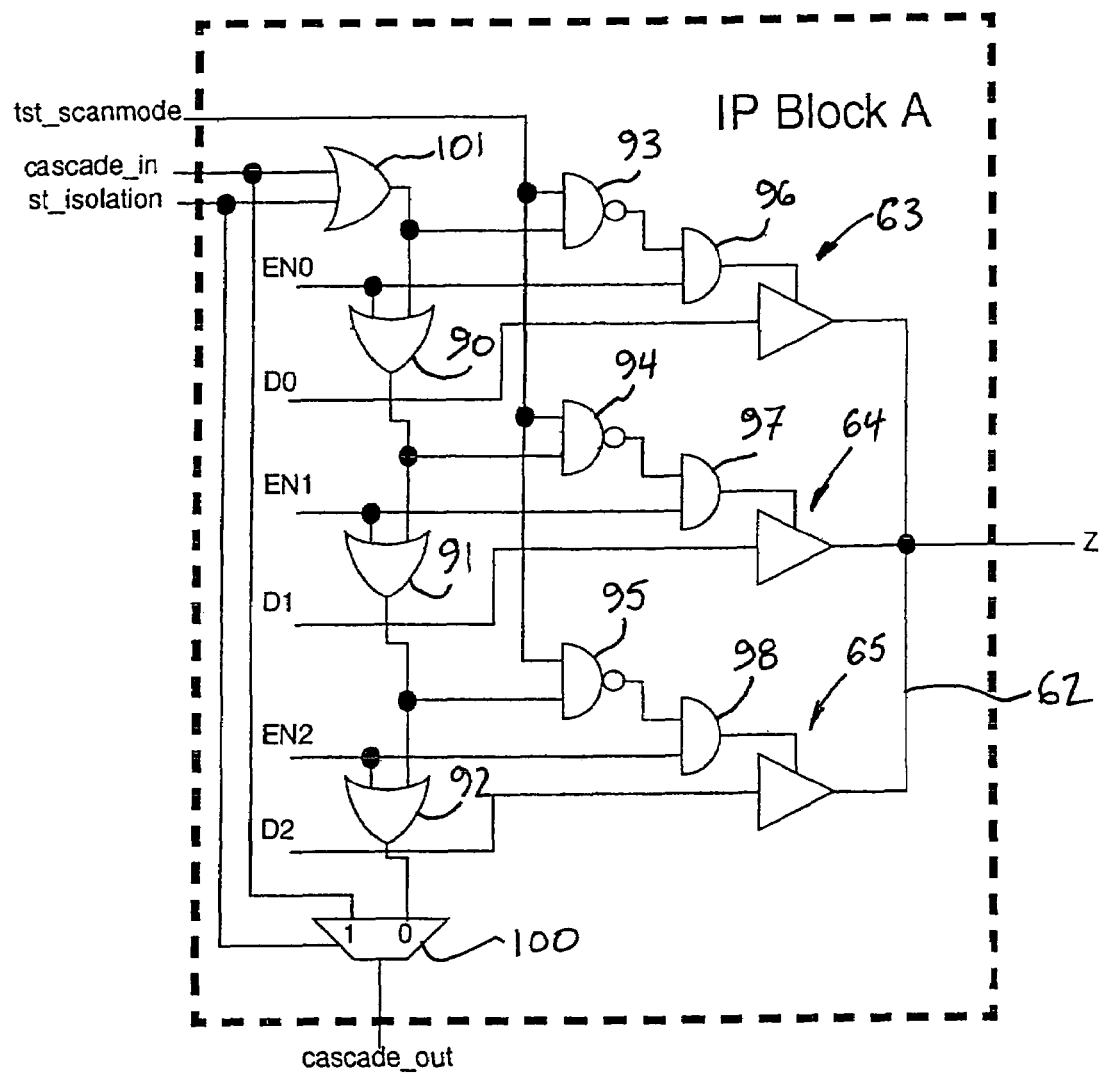
FIG. 10 is a schematic of a block for use in a distributed tristate bus arrangement, based on the arrangement of FIG. 9.
Figure 11:
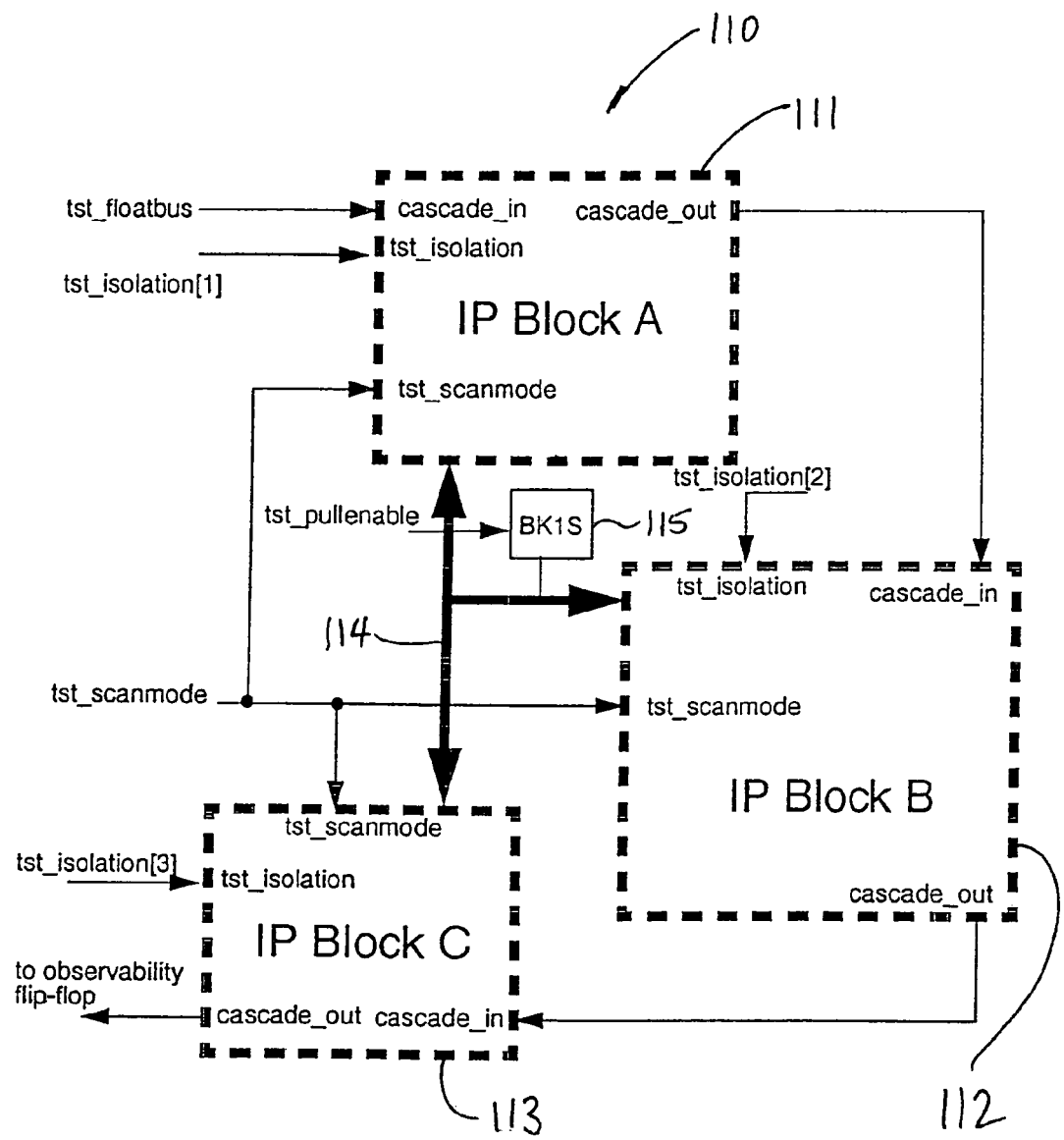
FIG. 11 is a block-level schematic showing interconnection of multiple blocks based on the block shown in FIG. 10, to form a distributed tristate bus arrangement.

An improved version of the circuit of FIG. 9 is shown in FIG. 10, allowing the arrangement of FIG. 11 to be used. The improvement comprises a multiplexor 100, which accepts as inputs a cascade_in signal (corresponding to the tst_floatbus signal of FIG. 9) and the output from the third OR gate 92. Which of the two inputs is passed to the output is controlled by a tst_isolation signal. When the tst_isolation signal is high, the multiplexor 100 outputs the cascade_in signal, and when the tst_isolation signal is low, the output of the third OR gate 92 is output by the multiplexor 100.

An additional OR gate 101 is also added to the circuit, accepting as inputs the cascade_in signal and the tst_isolation signal.

In use, the circuit operates as described in relation to FIG. 9. However, when the tst_isolation signal is pulled high, the enable inputs of all of the tristate buses in the block are disabled via the chain of OR gates 90, 91 and 92, and the cascade_in signal is passed out of the block via the multiplexor 100. In the event that the block receives a cascade_in signal, the enable inputs of the tristate cells 63, 64 and 65 are again disabled.

As shown in FIG. 11, an integrated circuit 110 can comprise multiple blocks 111, 112, 113, each of which is similar to that described in relation to FIG. 10. The cascade_out of the first block 111 is connected to the cascade_in of the second block 112, and the cascade_out of the second block 112 is connected to the cascade_in of the third block 113. The cascade_in of the first block receives a tst_floatbus signal, whilst the cascade_out of the third block 113 is sent to an observability flip-flop, as discussed above.

Each of the first second and third blocks 111, 112 and 113 also accepts a respective first, second and third independent tst_isolation signal. Using this signal, each of the blocks can independently be disabled to allow testing of other blocks or other areas of the circuitry to be tested without exceeding the designed current limits of the circuit as a whole.

It will be noted that, when a block is disabled by being "isolated", it still passes forward the cascade signal from its cascade_in input to its cascade out output. This ensures that downstream tristate cells can still be disabled during testing, as described above, even though an intermediate block might not be being tested.

The tristate cells associated with the first second and third blocks are connected to a common data bus 114. The common data bus 114 includes buskeeper circuitry 115, which responds to a tst_pullenable signal as described in relation to earlier embodiments.

With all of the embodiments above, it will be appreciated that the number and type of tristate cells used is not relevant to the operation of the invention. In the single block case, two or more tristate cells will benefit from the arrangement shown in FIG. 9. Where multiple block are used, one or more of the blocks may have as few as one tristate cells.

It will be appreciated that the operation of tristate buses, such as the placing of data onto the bus and the reading of data off the bus, are undertaken on the basis of timing signals provided by a system clock. For the purposes of clarity, timing information and clock signals generally are not illustrated or discussed in the description of the preferred embodiment, since a description of such matters would not aid an understanding of the present invention or the preferred embodiments thereof.

Although the invention has been described with reference to a number of specific examples, it will be appreciated by those skilled in the art that the invention can be embodied in many other forms.

The invention claimed is:

1. Circuitry for testing and implementing a distributed tristate bus arrangement, the distributed tristate bus arrangement including:
   a data bus;
   a first block having at least a first tristate cell including:
      a first enable input for receiving a first enable signal;
      a first data input for receiving data;
      a first data output in communication with the data bus;
      first cascade circuitry having a first cascade input for accepting a first test signal, the first cascade circuitry also accepting the first enable signal;
      a cascade output; and
      first test enabling circuitry for testing the first tristate cell when in a testing mode;
   a second block having at least a second tristate cell including:
      a second enable input for receiving a second enable signal;
      a second data input for receiving data;
      a second data output in communication with the data bus;
      second cascade circuitry having a second cascade input for accepting a second test signal, the second cascade circuitry also accepting the second enable signal;
      a cascade input operatively connected to the cascade output of the first cascade circuitry; and
      second test enabling circuitry for testing the second tristate cell when in a testing mode;
   the circuitry being configured to operate in the testing mode when a test enable signal is operative, and wherein if the first enable signal is supplied to the first enable input and the test enable signal is operative, the first cascade circuitry outputs a cascade out signal to the second cascade input via the cascade output thus causing the second cascade circuitry to disable the enable input of the second tristate cell, thereby to prevent contention on the data bus during scan testing.

2. Circuitry according to claim 1, wherein the first block includes one or more additional tristate cells of sequentially lower priority, each of the additional tristate cell having:
   respective enable inputs for receiving enable signals;
   respective data inputs for receiving data; and
   respective data outputs in communication with the data bus;
   the first cascade circuitry being configured to accept the enable signals of all of the respective additional tristate cells, the circuitry being configured such that in the testing mode, when an enable signal is supplied to one of the enable inputs and the test enable signal is operative, the cascade circuitry disables the enable inputs of all tristate cells of lower priority, and outputs the cascade out signal via the cascade out, thereby to prevent contention on the data bus during scan testing.

3. Circuitry according to claim 1, including one or more additional blocks, each of the additional blocks including:
   one or more tristate cells;
   a cascade input for receiving a cascade signal from the cascade output of a previous block; and
   cascade circuitry;
   the circuitry being configured such that in the testing mode, when an enable signal is supplied to one of the enable inputs and the test enable signal is operative, the cascade circuitry in the block receiving the enable signal disables the enable inputs of any tristate cells of lower priority in that block and, in the event there is a downstream block, outputs a cascade out signal to that block which in turn disables enables on all its tristate cells, the cascade output signal being rippled down to subsequent blocks such that all tristate cells in all blocks downstream of the block to which an enable signal is input are disabled.

4. Circuitry according to claim 1, wherein the cascade circuitry for each block includes:
   an OR gate for each of the tristate cells;
   an input of each OR gate being connected to the enable input of the corresponding tristate cell; and
   an output of each OR gate being connected to an input of one of the OR gates associated with a tristate cell further downstream.

5. Circuitry according to claim 4, wherein each block includes:
   an isolation OR gate configured to accept as inputs;
      an isolation signal; and
      a cascade signal from an upstream block; and
   a multiplexor controlled by the isolation signal;
   the circuitry being configured such that when the isolation signal is active the multiplexor passes the cascade input directly to the cascade output of the block, and when the isolation signal is inactive the multiplexor accepts an output from the OR gate associated with the lowest priority tristate cell in the block.

6. Circuitry according to claim 4 or 5, wherein each tristate cell in each of the blocks includes an associated isolating logic accepting as inputs the test enable signal and a cascade signal from the OR gate associated with the immediately upstream tristate cell, such that when the test enable signal is active and an enable signal is applied to one of the tristate cells, the OR gate associated with that cell causes the downstream OR gates and isolating logic to disable all downstream tristate cells.

7. Circuitry according to claim 1, further including buskeeper circuitry operatively connected to the data bus for receiving the test enable signal, the buskeeper circuitry being configured to act in a test mode when the test enable input is asserted and in a bus-keeping mode the when the test enable input is not asserted, wherein: in bus-keeping mode the circuitry maintains the last data value placed onto the bus; and in test mode, the circuit weakly pulls the bus to a logical 1 or 0 value.

8. Circuitry according to claim 7, wherein the buskeeping circuitry includes a buskeeper NOR gate for receiving the test enable signal as an input, wherein an output of the buskeeper NOR gate is connected to an input of a weakly driven inverter, and an output of the weakly driven inverter is connected to the data bus and to an second input of the buskeeper NOR gate.

9. Circuitry according to claim 1, wherein the circuitry is incapable of contention on the data bus during scan testing.

10. Circuitry for testing and implementing a distributed tristate bus arrangement, the distributed tristate bus arrangement including:
   a data bus;
   a first block having:
      a first tristate cell including:
      a first enable input for receiving a first enable signal;
      a first data input for receiving data;
      a first data output in communication with the data bus;
      first cascade circuitry having a first cascade input for accepting a first test signal, the first cascade circuitry also accepting the first enable signal;
      first test enabling circuitry for testing the first tristate cell when in a testing mode; and
      one or more additional tristate cells of sequentially lower priority, each of the additional tristate cell having:
         respective enable inputs for receiving enable signals; respective data inputs for receiving data; and respective data outputs in communication with the data bus; a cascade output; and a second block having at least a second tristate cell including: a second enable input for receiving a second enable signal; a second data input for receiving data; a second data output in communication with the data bus;
   a cascade output; and
   a second block having at least a second tristate cell including:
      a second cascade circuitry having a second cascade input for accepting a second test signal, the second cascade circuitry also accepting the second enable input;
      a cascade input operatively connected to the cascade output of the first cascade circuitry; and
      second test enabling circuitry for testing the second tristate cell when in a testing mode;
      the circuitry being configured to operate in the testing mode when a test enable signal is operative, and wherein if the first enable signal is supplied to the first enable input and the test enable signal is operative, the first cascade circuitry outputs a cascade out signal to the second cascade input via the cascade out thus causing the second cascade circuitry to disable the enable input of the second tristate cell, the first cascade circuitry being configured to accept the enable signals of all of the respective additional tristate cells, and when an enable signal is supplied to one of the enable inputs and the test enable signal is operative, the first cascade circuitry disables the enable inputs of all tristate cells of lower priority, and outputs the cascade out signal via the cascade out, thereby to prevent contention on the data bus during scan testing.

11. Circuitry according to claim 10, wherein the circuitry is incapable of contention on the data bus during scan testing.

* * * * *

UNITED STATES PATENT AND TRADEMARK OFFICE
CERTIFICATE OF CORRECTION

PATENT NO. : 7,234,089 B2  
APPLICATION NO. : 10/011257  
DATED : June 19, 2007  
INVENTOR(S) : Gary Morton It is certified that error appears in the above-identified patent and that said Letters Patent is hereby corrected as shown below:

Claim 3, col. 8, line 43, should read:  
block which in turn disables enables on all its tristate Signed and Sealed this Fourteenth Day of August, 2007

JON W. DUDAS  
*Director of the United States Patent and Trademark Office*